United States Patent [19]

Ohno et al.

[11] Patent Number: 4,494,996
[45] Date of Patent: Jan. 22, 1985

[54] IMPLANTING YTTRIUM AND OXYGEN IONS AT SEMICONDUCTOR/INSULATOR INTERFACE

[75] Inventors: Junichi Ohno, Yokohama; Takao Ohta, Tokyo, both of Japan

[73] Assignee: Tokyo Shibaura Denki Kabushiki Kaisha, Japan

[21] Appl. No.: 483,706

[22] Filed: Apr. 11, 1983

[30] Foreign Application Priority Data

Apr. 12, 1982 [JP] Japan .................................. 57-60536

[51] Int. Cl.³ ...................... H01L 21/265; H01L 7/00
[52] U.S. Cl. .................................... 148/1.5; 29/576 B; 148/175; 148/187; 357/63; 357/91
[58] Field of Search ...................... 148/1.5, 187, 175; 29/576 B; 357/91, 63

[56] References Cited

U.S. PATENT DOCUMENTS

| | | | |
|---|---|---|---|
| 3,674,552 | 7/1972 | Heywang | 117/217 |
| 4,177,084 | 12/1979 | Lau et al. | 148/1.5 |
| 4,178,191 | 12/1979 | Flatley | 148/1.5 |

OTHER PUBLICATIONS

Homma et al., Jap. Jour. Appl. Phys. 21 (1982) 890.
Jastrzebski et al., Jour. Crystal Growth, 58 (1982) 37.
Rao, D. B., Jour. Crystal Growth, 58 (1982) 79.
Maeyama et al., Jap. Jour. Appl. Phys. 21 (1982) 744.
Y. Yamamoto, I. H. Wilson and T. Itoh, "Gettering Effect by Oxygen Implantation in SOS," Appl. Phys. Lett. vol. 34, vol. 6.15, 15, Mar. 1979.

*Primary Examiner*—Upendra Roy
*Attorney, Agent, or Firm*—Finnegan, Henderson, Farabow, Garrett & Dunner

[57] ABSTRACT

A semiconductor device comprising an insulating substrate such as sapphire and a semiconductor element region formed on the substrate, wherein an insulating layer containing yttrium or a lanthanide element is interposed between the substrate and semiconductor element region. A method of manufacturing a semiconductor device such as MOS/SOS wherein yttrium or a lanthanide element is ion implanted into an interface between the substrate and the semiconductor film formed on the substrate to form an insulating layer containing yttrium or a lanthanide element at the interface.

4 Claims, 14 Drawing Figures

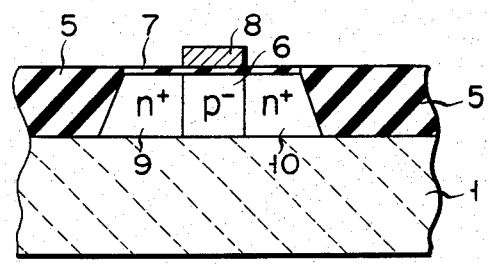
F I G. 1(E)
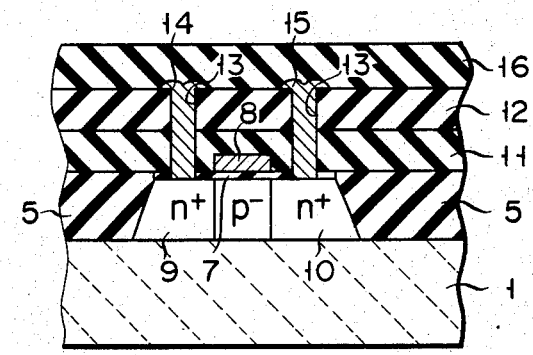
F I G. 1(F)
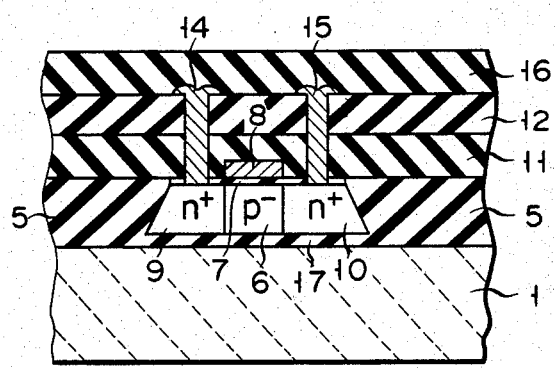
F I G. 2

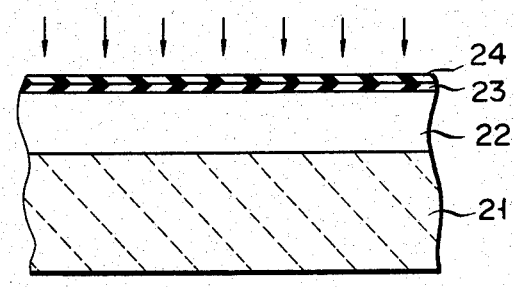
F I G. 3(A)
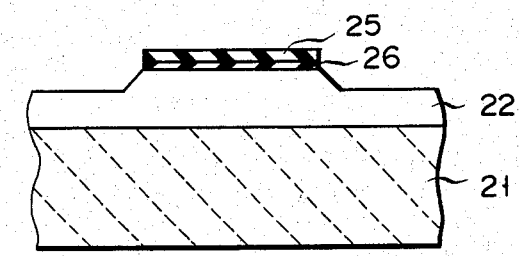
F I G. 3(B)
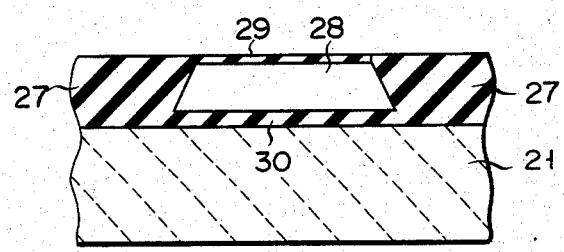
F I G. 3(C)
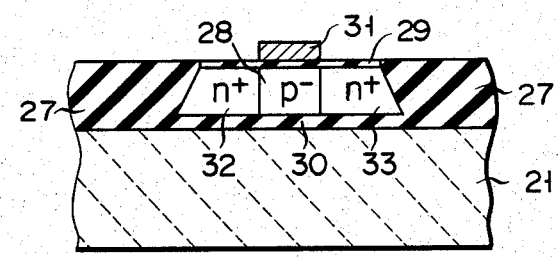
F I G. 3(D)
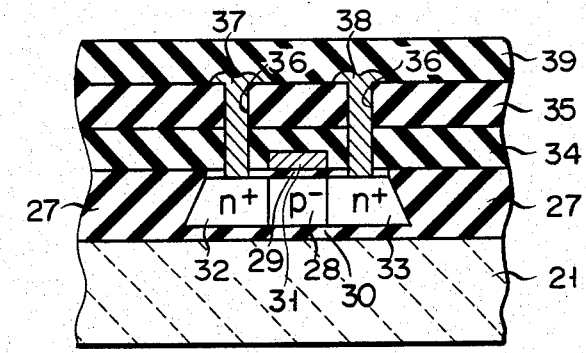
F I G. 3(E)

IMPLANTING YTTRIUM AND OXYGEN IONS AT SEMICONDUCTOR/INSULATOR INTERFACE

BACKGROUND OF THE INVENTION

This invention relates to a semiconductor device with a semiconductor element formed on an insulating substrate of sapphire or the like and a method of manufacturing the same.

The semiconductor device of this kind, e.g., an n-channel MOS/SOS, is usually manufactured in the following way.

As shown in FIG. 1A, a silicon film 2 is first epitaxially grown on a sapphire substrate 1. Then, $Si_3N_4$ and $SiO_2$ film patterns 3 and 4 are successively formed by depositing and patterning $SiO_2$ and $Si_3N_4$ films. The silicon film 2 is then anisotropically etched using a KOH etchant and the $Si_3N_4$ and $SiO_2$ film patterns 3 and 4 as a mask (as shown in FIG. 1B). Then an oxide film 5 and an island silicon film 6 isolated by the oxide film 5 are formed through a thermal treatment at a high temperature and in an oxygen atmosphere with the $Si_3N_4$ film pattern 3 as anti-oxidation mask (as shown in FIG. 1C).

Thereafter, the $Si_3N_4$ and $SiO_2$ film patterns 3 and 4 are removed, and a gate oxide film 7 contiguous with the surface of the island silicon film 6 is formed in a channel formation region thereof by ion implanting a p-type impurity, e.g., boron, and then thermally treating the system (as shown in FIG. 1D). A phosphorus-doped polycrystalline silicon film is then deposited to cover the entire surface, and then it is patterned to form a gate electrode 8 (as shown in FIG. 1E). Further, n+-type source and drain regions 9 and 10 are formed by ion implanting arsenic with the gate electrode 8 and oxide film 5 used as mask and through subsequent activation (as shown in FIG. 1E). Subsequently, a CVD-$SiO_2$ film 11 and a boron phosphorus silicide (BPSG) film 12 are successively deposited to cover the entire surface, the BPSG film 12 being subsequently fused to flatten the surface. Contact holes 13 are then formed to penetrate the BPSG film 12, CVD-$SiO_2$ 11 and gate oxide film 7. An aluminum film is then vacuum deposited to cover the entire surface, and then patterned to form aluminum leads 14 and 15 filling the contact holes 13 and connected to the source and drain regions 9 and 10 (as shown in FIG. 1F).

With the semiconductor device formed in this way, however, the interface region between the sapphire substrate 1 and silicon film 2 (i.e., island silicon film 6) has an imperfect crystal structure so that it is inverted to cause the commonly termed back-channel current, which flows between the source and drain regions 9 and 10. In addition, the mobility is reduced. It is thought that the imperfect crystal structure mainly results from the following three causes.

(1) Mismatch of crystal:

The (100) plane of the silicon film 2 grows on the ($1\bar{1}02$) plane of the sapphire substrate 1, and a mismatch of approximately 12.5% results from this difference in the crystal structure.

(2) Effects of the sapphire substrate:

The silicon film 2 is epitaxially grown atop the sapphire substrate 1 using silane gas ($SiH_4$ gas), so that the following secondary reactions occur.

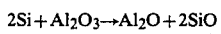

and

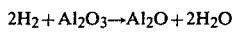

The main reaction is adversely affected by these secondary reactions.

(3) Stress:

The coefficient of thermal expansion of the sapphire substrate 1 is as high as approximately twice the coefficient of thermal expansion of the silicon film 2. Therefore, when the SOS wafer is quickly cooled down from a high temperature, the sapphire substrate 1 compresses, thus causing defects in the silicon film 2.

To cope with this drawback, it has been proposed to epitaxially grow a single crystal silicon film on the sapphire substrate 1 and to form an oxide film 17 in the neighborhood of the interface between the substrate 1 and silicon film, as shown in FIG. 2, by ion implanting oxygen with an acceleration voltage of 150 KeV and at a dosage of $1.2 \times 10^{18}/cm^2$, for example, and then thermally treating the system at 1,150° C. for 2 hours. The SOS wafer prepared in this way is used to manufacture the n-channel MOS/SOS in the manner as described above. In this case, the drain leak current can be reduced to some extent. However, $Al_2O$ and other products of the secondary reactions noted above cannot be effectively avoided.

It has also been proposed to ion implant boron into the island silicon film for threshold control and also ion implant boron such that there is a peak in the interface between the sapphire substrate and island silicon film, thereby preventing the inversion in the neighborhood of the interface. However, there is an increasing demand to reduce the thickness of the silicon film, which poses difficulties in the control of the impurity profile between the surface of the silicon film and the interface thereof with the sapphire substrate. In addition, since the ion implantation is performed twice, defects are more liable to result.

SUMMARY OF THE INVENTION

An object of the invention is to provide a semiconductor device, more particularly a semiconductor device with a semiconductor element formed on an insulating substrate such as an MOS/SOS, which permits reduction of the drain leak current and improvement of the mobility, and also a method of manufacturing the same.

A first feature of the invention resides in a semiconductor device, which comprises an insulating substrate, a semiconductor element region formed on the substrate and an insulating layer formed in the neighborhood of the interface between the substrate and semiconductor element region, and in which the insulating layer includes yttrium or a lanthanide element.

A second feature of the invention resides in a method of manufacturing a semiconductor device with a semiconductor element formed on an insulating substrate, which comprises a step of forming a semiconductor film on an insulating substrate, a step of ion implanting yttrium and oxygen or a lanthanide element and oxygen into the neighborhood of the interface between the substrate and semiconductor film; and a step of forming an insulating layer containing yttrium or a lanthanide element in the neighborhood of the interface.

Basically, according to the invention a semiconductor film is grown on an insulating substrate, yttrium and oxygen or a lanthanide element and oxygen are ion implanted into the neighborhood of the interface between the substrate and semiconductor film, and then the system is thermally treated, thereby improving the instable state of the neighborhood of the interface between the insulating substrate and the semiconductor layer that causes the drain leak current and reduction of the mobility.

BRIEF DESCRIPTION OF THE DRAWINGS

FIGS. 1A through 1F are sectional views illustrating a prior art method of manufacturing an MOS/SOS;

FIG. 2 is a sectional view showing a prior art MOS/SOS;

FIGS. 3A through 3E are sectional views showing a method of manufacturing an MOS/SOS embodying the invention.

DETAILED DESCRIPTION OF THE PREFERRED EMBODIMENT

Figure 1A:
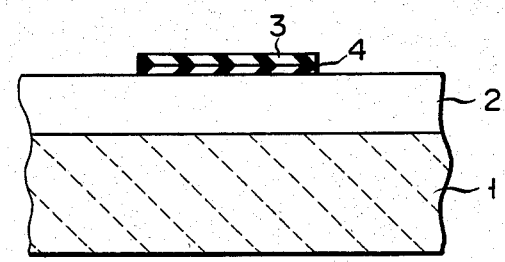
Figure 1B:
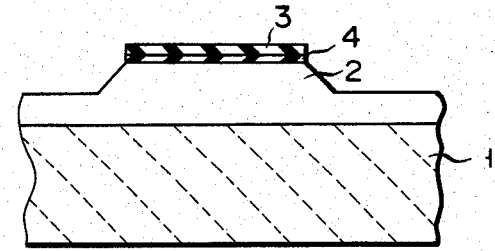
Figure 1C:
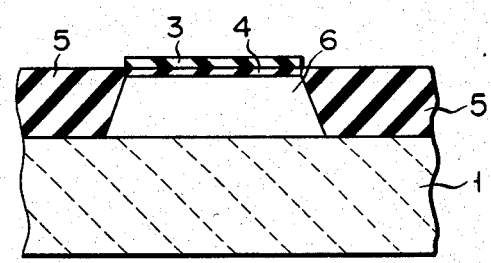
Figure 1D:
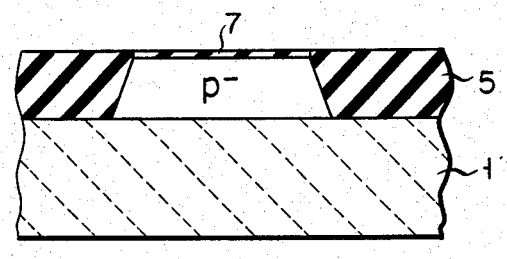

An example of the manufacture of an n-channel MOS/SOS according to the invention will now be described.

(1) A silicon film 22 with a crystal orientation of the (100) plane was epitaxially grown to a thickness of 0.6 μm atop a sapphire substrate ($\alpha$-$Al_2O_3$) 21 with a crystal orientation of the ($1\bar{1}02$) plane and a thickness of 600 μm using the pyrolysis of silane ($SiH_4$), as shown in FIG. 3A. Then, yttrium (Y) is ion implanted through the $Si_3N_4$ and $SiO_2$ films 24 and 23 into the silicon film 22 using yttrium chloride ($YCl_3$) as an ion source and with the acceleration energy controlled such that the concentration is $10^{17}$/cm$^3$. Further, oxygen was ion implanted with the acceleration energy controlled in the same way as for the yttrium ion implantation. Subsequently, an $SiO_2$ film 23 with a thickness of 600Å and a $Si_3N_4$ film 24 with a thickness of 4,500Å are successively formed on the silicon film 22.

(2) The $Si_3N_4$ and $SiO_2$ films 24 and 23 were then patterned using photoetching techniques to form $Si_3N_4$ and $SiO_2$ film patterns 25 and 26 (as shown in FIG. 3B). The silicon film 22 was then etched by approximately 0.3 μm with the $Si_3N_4$ and $SiO_2$ film patterns 25 and 26 used as mask.

(3) An oxide film 27 was then formed in place of the etched portion of the silicon film 22 by carrying out thermal oxidation with the $Si_3N_4$ film pattern 25 as an anti-oxidation mask and at a temperature of 900° C. for 10 hours (as shown in FIG. 3C). The $Si_3N_4$ and $SiO_2$ film patterns 25 and 26 were then successively removed, and then a gate oxide film 29 with a thickness of 500Å was formed to cover the island silicon film 28 isolated by the oxide film 27 by carrying out thermal oxidation again at 950° C. for one hour. In the two thermal treatments carried out for forming the oxide film 27 and gate oxide film 28 respectively, yttrium and oxygen that had been previously ion implanted reacted with aluminum and oxygen from the sapphire substrate 21, whereby an insulating film 30 containing yttrium was formed. Although not clearly understood, it is thought that at a temperature in the neighborhood of 1,000° C. yttrium oxide ($Y_2O_3$) and aluminum oxide ($Al_2O_3$) are converted into such definite-proportional compounds as $2Y_2O_3.Al_2O_3$, $3Y_2O_3.5Al_2O_3$ and $5Al_2O_3 + \alpha$-$Al_2O_3$ and such indefiniteproportional compounds as $Y_xAl_yO_z$ (where x, y and z are positive integers) and these compounds are introduced into the amorphous silicon film region to form the insulating film 30.

(4) Subsequently, a p-type impurity, e.g., boron, was selectively ion implanted through the gate oxide film 29 into a channel formation region in the island silicon layer 23 and then activated. Then, phosphorusdoped polycrystalline silicon film was deposited on the entire surface of the system and then patterned to form a gage electrode 31 (as shown in FIG. 3D). Then, an n-type impurity, e.g., arsenic, was selectively ion implanted through the gate oxide film 29 into the island silicon film 28 with the gate electrode 31 used as mask and then activated, thus forming n+-type source and drain regions 32 and 33 (as shown in FIG. 3D).

(5) CVD-$SiO_2$ and BPSG films 34 and 35 were then successively deposited on the entire wafer surface, and the BPSG film 35 was then flattened by fusing it (as shown in FIG. 3E). Then contact holes penetrating the BPSG film 35, CVD-$SiO_2$ film 34 and gate oxide film 29 were formed. An aluminum film was then deposited on the entire surface and patterned to form aluminum leads 37 and 38 filling the contact holes 36 and connected to the respective source and drain regions 32 and 33. Finally, a PSG film 39 is deposited on the entire surface, thus producing an n-channel MOS/SOS.

Figure 4:
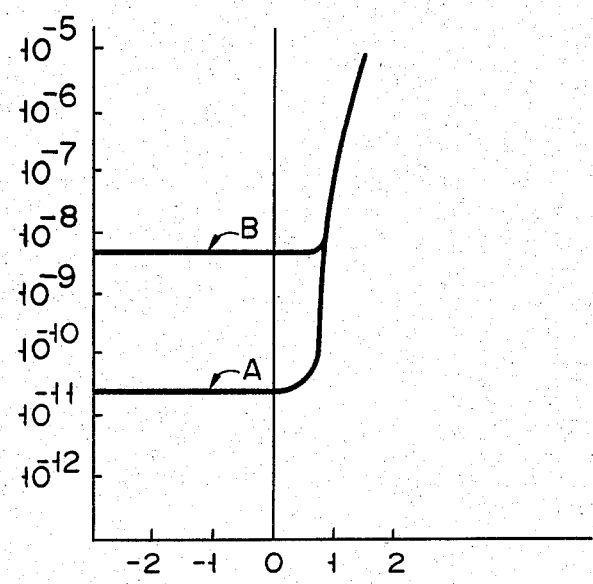
FIGS. 4 and 5 are graphs showing the $I_{DS}$-$V_{GS}$ characteristics of MOS/SOSs according to the invention and in the prior art.

The drain current ($I_{DS}$) of the n-channel MOS/SOS obtained in the above way (with the channel length set to 2 μm and the channel width set to 100 μm) was examined by applying a voltage of +5 volts to the drain region 33 and varying the voltage ($V_{GS}$) applied to the gate electrode 31. FIGS. 4 shows $I_{DS}$-$I_{GS}$ characteristics of the MOS/SOS according to the invention (curve A) and of an n-channel MOS/SOS without any insulating layer in the neighborhood of the interface between the sapphire substrate and insulating layer (curve B). It will be seen that according to the invention the drain leak current can be greatly reduced, namely, by about 2 decimal places as compared to that in the prior art MOS/SOS.

The material that is ion implanted together with oxygen is not limited to yttrium, and similar effects may be obtained with a lanthanide element which has similar chemical characteristics, i.e., lanthanium, cerium, praseodymiun, neodymium, samarium, enropium, godolimium, terbium, thorium, ytterbium or lutetium.

Figure 5:
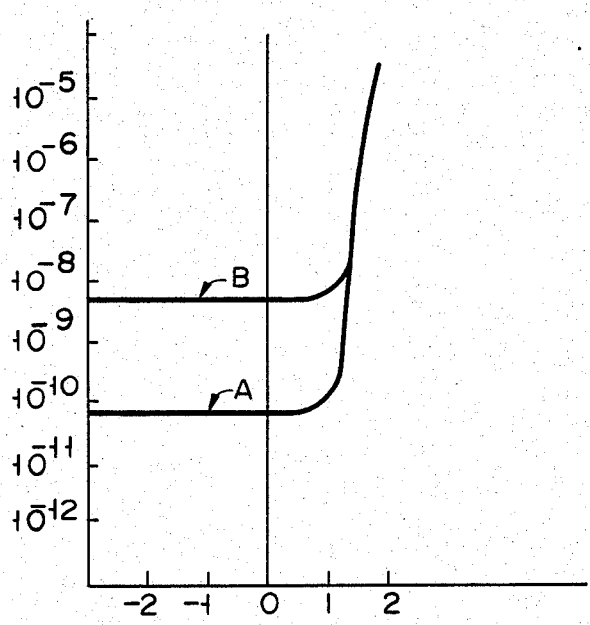

FIG. 5 shows the $I_{DS}$-$V_{GS}$ characteristic of an nchannel MOS/SOS, which was obtained in the same method as for the embodiment shown in FIGS. 3A through 3E except for that lanthanum chloride ($LaCl_3$) was used as the ion source in lieu of $YCl_3$, with a voltage of +5 volts applied to the drain region 33. In the Figure, curve A represents the characteristic of the MOS/SOS according to the invention, while curve B represents the characteristic of an MOS/SOS which has no insulating layer formed in the neighborhood of the interface between the insulating substrate and island silicon film. In this case, as in the case of FIG. 4, $I_{DS}$ can be reduced by about two decimal places compared to the prior art characteristic.

The acceleration energy and dosage may be set such that the concentration of yttrium or a lanthanide metal ranges from $10^{17}$ to $10^{22}$ cm$^3$. The temperature of the thermal treatment may be set below 1,400° C. but sufficiently high to form the insulator, that is, above approximately 900° C.

The invention is not limited to the manufacture of n-channel MOS/SOSs, but it is applicable to p-channel MOS/SOSs and CMOS/SOSs as well.

As has been described in the foregoing, according to the invention it is possible to provide a semiconductor device such as an MOS/SOS, with which it is possible to reduce the drain leak current and improve mobility.

1. A method of manufacturing a semiconductor device with a semiconductor element formed in an insulating substrate comprising:
 a step of forming a semiconductor film on an insulating substrate;
 a step of ion implanting yttrium and oxygen or a lanthanide metal and oxygen in the neighborhood of said substrate and semiconductor film; and
 thermally treating the resultant system, thereby forming an insulating layer containing yttrium or a lanthanide metal as said insulating layer in the neighborhood of said interface.

2. The method according to claim 1, wherein the temperature of said thermal treatment is between 900° and 1,400° C.

3. The method according to claim 1, wherein said ion implantation is done under such acceleration energy and dosage conditions that the concentration of yttrium or lanthanide metal is between $10^{17}$ and $10^{22}/cm^3$.

4. The method according to claim 3, wherein said ion implantation is done with the acceleration set to 150 KeV and dosage set to $1.2 \times 10^{18}/cm^2$.

* * * * *